United States Patent [19]

Carroll et al.

[11] Patent Number: 5,303,202
[45] Date of Patent: Apr. 12, 1994

[54] METHOD FOR DETECTING BREAKS IN GEOPHONE CABLES FOR SEISMIC DATA ACQUISITION SYSTEM

[76] Inventors: Paul E. Carroll, 12203 Mile Dr., Houston, Tex. 77065; Glenn D. Fisseler, 7918 Roos, Houston, Tex. 77036

[21] Appl. No.: 115,880

[22] Filed: Sep. 1, 1993

[51] Int. Cl.⁵ ............................................. H04B 17/00
[52] U.S. Cl. ..................................................... 367/13
[58] Field of Search .................... 367/13; 73/1 DV; 324/526, 525, 522

[56] References Cited

U.S. PATENT DOCUMENTS 4,184,143  1/1980  Stafford .............................. 367/13
4,394,616  7/1983  Browne et al. ...................... 324/522

Primary Examiner—Daniel T. Pihulic
Attorney, Agent, or Firm—Bush, Moseley & Riddle

[57] ABSTRACT

A method for a seismic data acquisition system (FIG. 1) for determining whether a geophone circuit break is in a seismic cable conductor pair (22) or in a takeout conductor pair (26). A resistor (32, 32A) is positioned across the takeout conductor pair (26) for a geophone group (20). An impedance measuring device (30) determines if the break is in the seismic cable conductor pair (22) by measuring infinity for an open circuit, or by measuring the impedance of the resistor (32, 32A) if the break is in the takeout conductor pair (26).

5 Claims, 2 Drawing Sheets

METHOD FOR DETECTING BREAKS IN GEOPHONE CABLES FOR SEISMIC DATA ACQUISITION SYSTEM

FIELD OF THE INVENTION

This invention relates to geophone cables for seismic data acquisition systems in seismic exploration, and more particularly to a method for detecting breaks in geophone circuits including multiconductor geophone cables and geophone groups.

BACKGROUND OF THE INVENTION

For seismic data acquisition in seismic exploration, geophones are usually deployed in groups at each detector location with series connected geophone groups connected in parallel to form a string. Each string is attached to a takeout in the main cable which feeds to a specific channel in the recording system. Frequently, several multiconductor cables are deployed to adequately sample the signals from the earth. Thus, seismic signals are detected by arrays of single geophones, and field equipment is provided to record the reflected seismic signals. The field equipment typically includes remote acquisition electronics, telemetry and central control electronics for control, display and storage. Oftentimes, many miles of cables, for example, fifty miles of multiconductor cables with geophone strings spread over five to fifteen square miles may be used.

One of the problems in seismic data acquisition is broken wires in the cables and geophone groups. These breaks are caused by various reasons, such as rodent gnawing, rock cuts, thorn piercing, and so forth. Cables could be built more ruggedly but costs of materials, additional cable weight and increased labor deployment costs are the result. Normally a broken wire involves replacing the cable, or the geophone group, or both. When the break is in the geophone circuits, there is a problem in determining whether to replace the multiconductor cable, the takeout cable, or both.

SUMMARY OF THE INVENTION

The seismic data acquisition system used with the present invention includes a battery-powered field module (ALX) that serves as the communication device within the seismic spread between the remote acquisition modules (RSX), other ALX's, and the central recorder and computer. The ALX's allow the operator to employ a wide range of field configurations and deployment options. Each seismic line requires an advanced line tap (ALX). The ALX provides for testing and control of all RSX modules on that line along the seismic spread and can accommodate from 1 to around 500 active seismic lines depending on the particular configuration.

A battery-powered remotely deployable field unit forms the RSX and collects, filters, amplifies, and digitizes seismic data which is then transmitted to the central recorder and computer via the ALX's. The RSX uses a twisted wire pair cable and is capable of self calibration, test and analysis while deployed. A plurality of geophone strings or groups are connected to the RSX through takeouts for each geophone group.

This invention provides a method for such a seismic data acquisition system to detect whether a break in an inoperable geophone circuit is caused by a geophone cable pair in the multiconductor cable or in the geophone group by measuring of the impedance in the circuit. By locating the break, a rapid replacement of the defective component may be achieved.

The invention comprises the positioning of a high ohmic value impedance, such as a resistor or capacitor, across the leads of a takeout for a geophone string or group generally adjacent the connection of the takeout to the multiconductor cable, and then measuring the impedance for the geophone circuit. If the impedance measuring device measures infinity, then this signifies an open circuit with the break in the multiconductor cable. A break in the geophone group appears as a high impedance similar to the impedance value of the resistor indicating a break in the geophone group.

Other features and advantages of the invention will be more apparent after referring to the following specification and drawings.

DESCRIPTION OF THE INVENTION

Figure 1:
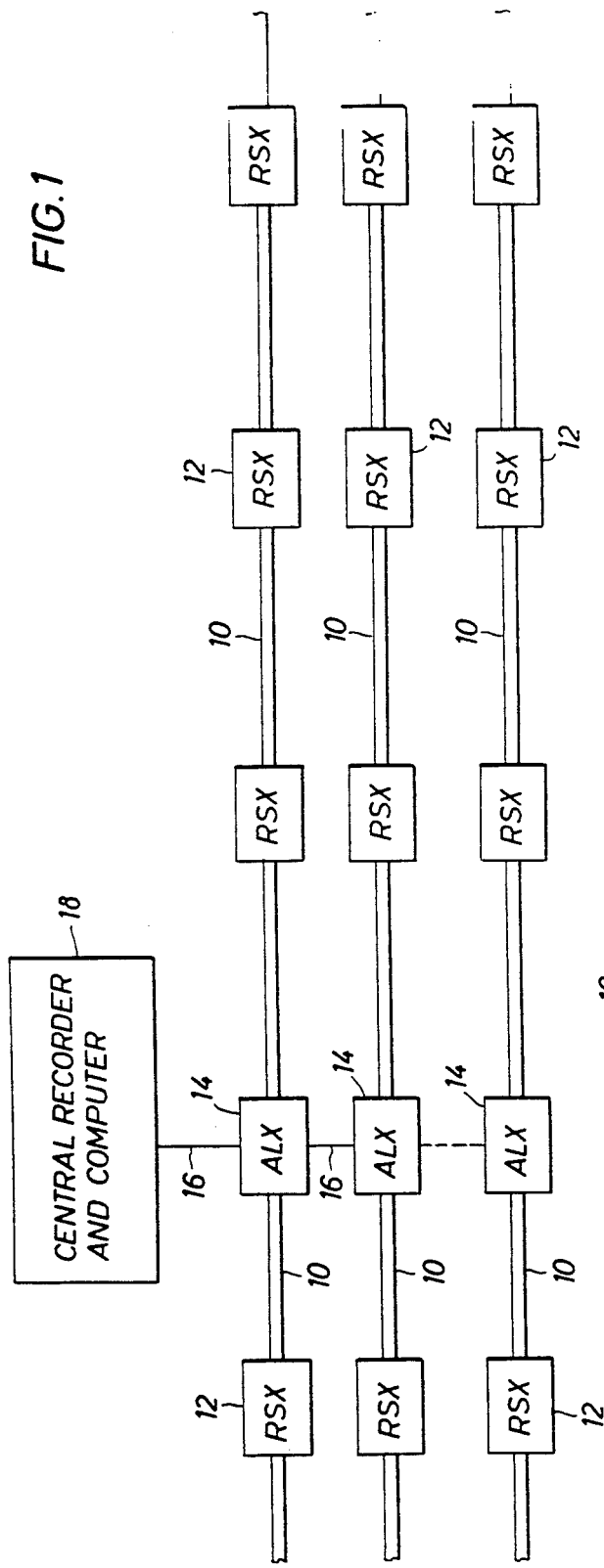
FIG. 1 is a diagrammatic view of a seismic data acquisition system having a plurality of remote acquisition units (RSX's) connected by multiconductor cables to field modules (ALX's) for a central recorder and computer.

Referring to FIG. 1, a seismic data acquisition system for use with the present invention is illustrated schematically including multiconductor cables 10 for transmitting seismic data from geophones to remotely deployable data acquisition field units (RSX's) 12 connected to field modules (ALX's) 14. Field modules 14 are connected by multiconductor cables 16 to a central recorder and computer generally indicated at 18. Signals representative of seismic reflections from earth strata are received by the geophones and transmitted to data acquisition field units 12 for transmission to central recorder and computer 18 for recording. Field units 12 collect, filter, amplify, and digitize the seismic data for transmission to central recorder and computer 18.

Figure 2:
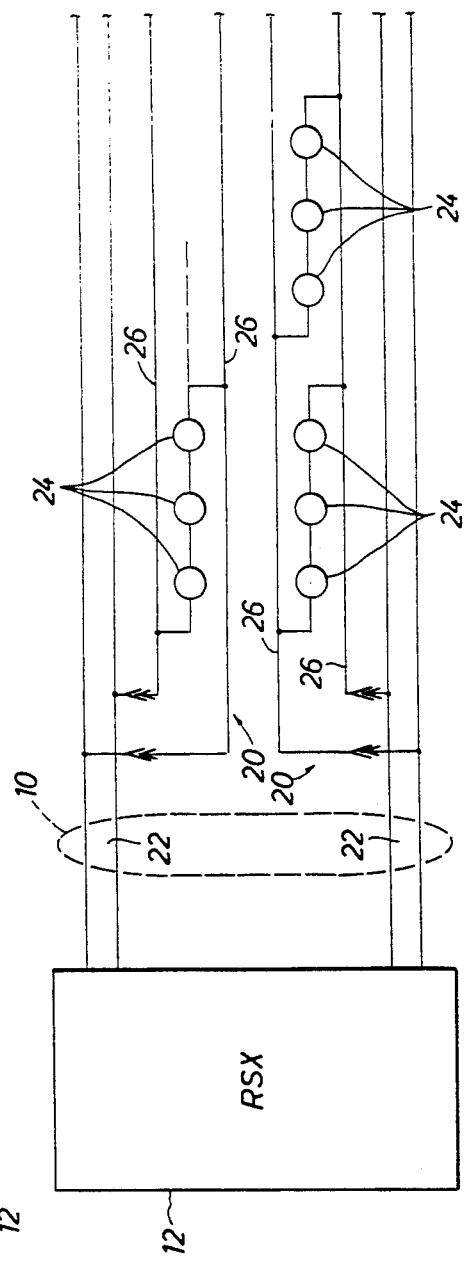
FIG. 2 is a schematic view of a plurality of geophone takeouts connected to conductor pairs extending from a remote acquisition unit (RSX)

A field crew positions geophones over a relatively large surface area, e.g., several square miles. Referring to FIG. 2, a plurality of geophone groups or strings indicated generally at 20 have leads 26 for a takeout connected to a twisted pair or seismic cable conductor pair 22 which is encased within multiconductor cable 10 to the associated data acquisition field unit 12. The takeout is an integral molded member extending from pair 22 to the takeout connector, then to takeout conductor pair 26. Each geophone group 20 as shown in the drawings includes a plurality of geophones 24 arranged in parallel across takeout leads 26 connected to twisted pair 22. It is understood, however, that a geophone group may comprise one geophone, multiple geophones, or multiple geophone strings.

Figure 3:
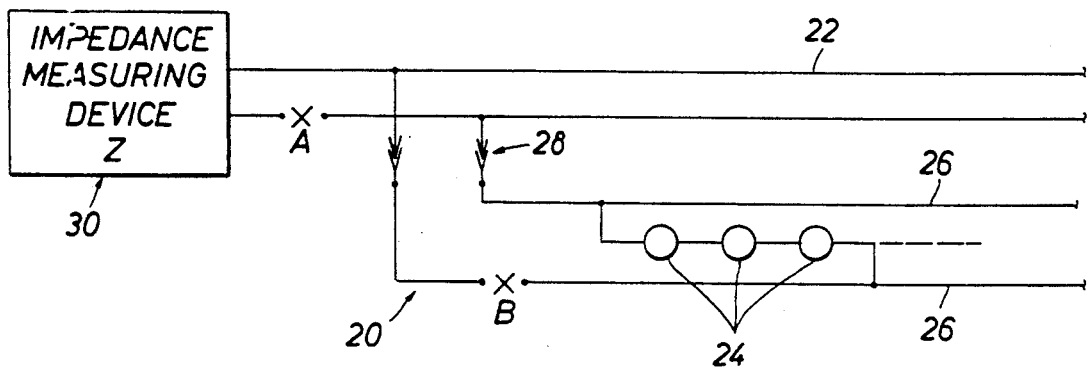
FIG. 3 is a schematic view of a geophone takeout connected to a seismic conductor cable with an impedance measuring device connected to the conductor cable for detecting a break.

Referring to FIG. 3, a takeout connector 28 comprising a detachable plug is illustrated for detachably connecting geophone group 20 to pair 22. An impedance measuring device 30 is connected to cable 22 to determine if a break is in pair 22 such as shown at A or in the takeout pair 26 for geophone string 20 such as shown at B. If a break is located either at A or B for the arrangement of FIG. 3, an open circuit is measured by impedance measuring device 30 as infinity. However, it can not be determined from the measurement if the break is in cable pair 22 or in the geophone group 20. A field crew has replacement cables for the takeout cable and for twisted pair wire cable 22, but a crew can not determine from such measurement whether to replace the cable 10, or the geophone group 20.

Figure 4:
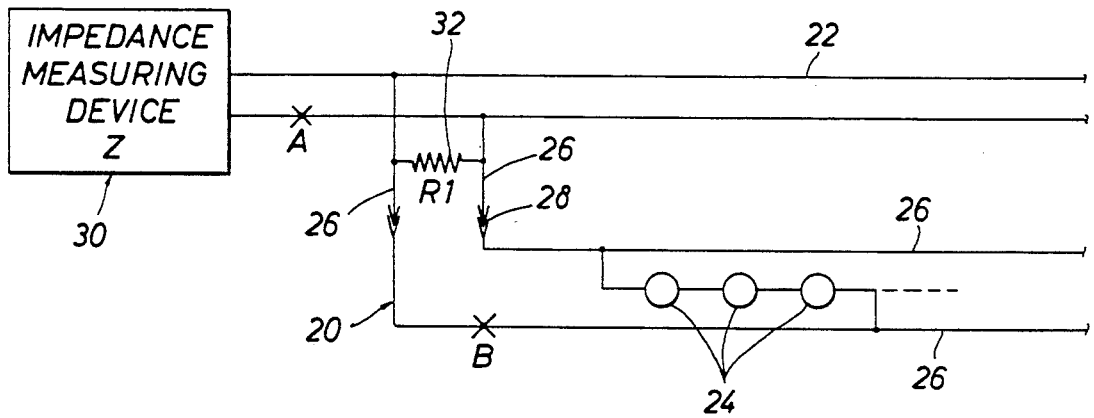
FIG. 4 is a schematic view of one embodiment of this invention in which an impedance is positioned across the leads of a geophone takeout inwardly of a takeout connector.

The present invention is directed particularly to a method for determining whether the break is in cable 10 (that is, in pair 22) or the takeout leads 26 for string 20. Referring to FIG. 4, a resistor R1 is shown at 32 across leads 26 for the geophone takeout between takeout connector 28 and pair 22. The impedance upon measurement by measuring device 30 is measured as infinity for an open circuit if the break occurs at A in pair 22. If the break is in the geophone string 20 beyond resistor 32 as shown at B, the impedance measured will be the impedance of resistor R1. Thus, the break can be located as being inwardly or outwardly of resistor 32 relative to cable 22. If the break is determined to be outwardly of resistor 32, only the geophone string 20 is required to be replaced. If the break is determined to be inwardly of resistor 32, cable 22 is required to be replaced.

Figure 5:
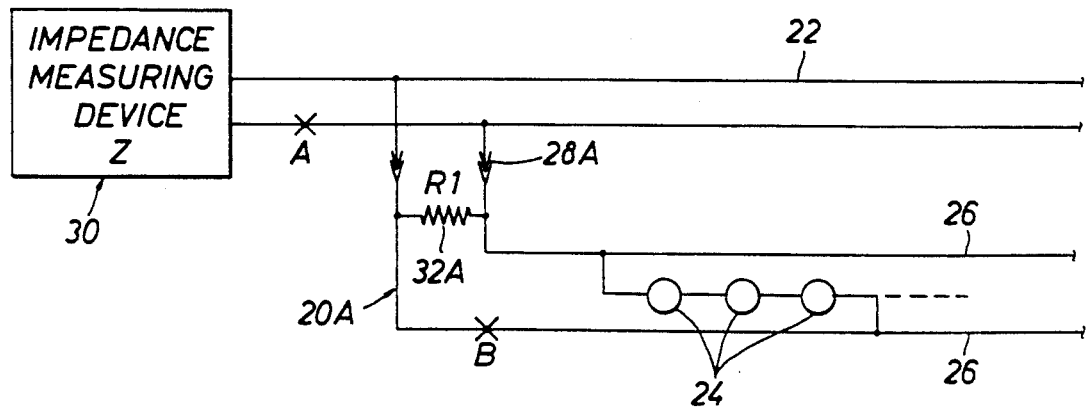
FIG. 5 is a schematic view of another embodiment of this invention in which an impedance is positioned across the leads of a geophone takeout outwardly of a takeout connector.

Referring to FIG. 5, an alternative embodiment similar to the arrangement of FIG. 4 is illustrated in which a resistor R1 is shown at 32A across leads 26 for the takeout outwardly of takeout connector 28A relative to pair 22. If measuring device 30 measures the impedance of resistor 32A, it is definite that the break is in the geophone string 20 outwardly of takeout connector 28. However, if measuring device 30 measures infinity for an open circuit, the open circuit could be in cable 22 or at takeout connector 28A where geophone string 20A is plugged into takeout connector 28A.

While the impedance for the methods illustrated in FIGS. 4 and 5 has been illustrated as a resistor, the impedance could be provided by a capacitor, inductor, semiconductor active device, or other suitable impedance device.

While preferred embodiments of the present invention have been illustrated in detail, it is apparent that modifications and adaptations of the preferred embodiment will occur to those skilled in the art. However, it is to be expressly understood that such modifications and adaptations are within the spirit and scope of the present invention as set forth in the following claims.

What is claimed is:

1. In a seismic data acquisition system including a takeout conductor pair connected at a takeout connection to a seismic cable conductor pair, a method of identifying the location of a break in the conductor pair or the takeout conductor pair comprising the steps of:
   electrically connecting a test impedance across the takeout conductor pair adjacent the connection of said takeout conductor pair to said seismic cable conductor pair;
   measuring the impedance of said seismic cable conductor pair at its end;
   identifying a break in said seismic cable conductor pair between said end of said seismic cable conductor pair and said takeout connection if said impedance is approximately infinite; and
   identifying a break in said takeout conductor pair if said impedance is approximately the same as said test impedance.

2. The method as set forth in claim 1 further including the steps of:
   providing a takeout connector for the takeout conductor pair; and
   electrically connecting the test impedance across the takeout conductor pair between the takeout connector and the seismic cable conductor pair.

3. The method as set forth in claim 1 further including the steps of:
   providing a takeout connector for the takeout conductor pair; and
   electrically connecting the test impedance across the takeout conductor pair outwardly of said takeout connector relative to said seismic cable conductor pair;

4. The method as set forth in claim 1 further including the steps of:
   electrically connecting a resistor across the takeout conductor pair to define said test impedance.

5. The method as set forth in claim 1 further including the step of:
   connecting a string of geophones to said takeout conductor pair for providing seismic data to said seismic cable conductor pair for transmission.

* * * * *